Dec. 13, 1960 P. D. ERATH 2,964,088

ELECTRICAL COMPONENT LEAD PREPARATION APPARATUS

Filed Feb. 3, 1958 3 Sheets-Sheet 1

INVENTOR
PHILIP D. ERATH,
BY Donald L. Royer
AGENT

Dec. 13, 1960 P. D. ERATH 2,964,088

ELECTRICAL COMPONENT LEAD PREPARATION APPARATUS

Filed Feb. 3, 1958

3 Sheets-Sheet 2

INVENTOR.
PHILIP D. ERATH,
BY Donald L. Royer
AGENT

ELECTRICAL COMPONENT LEAD PREPARATION APPARATUS

Filed Feb. 3, 1958 3 Sheets-Sheet 3

INVENTOR.
PHILIP D. ERATH,
BY Donald L. Royer
AGENT.

United States Patent Office 2,964,088

Patented Dec. 13, 1960

2,964,088

ELECTRICAL COMPONENT LEAD PREPARATION APPARATUS

Philip D. Erath, Inglewood, Calif., assignor to Hughes Aircraft Company, Culver City, Calif., a corporation of Delaware Filed Feb. 3, 1958, Ser. No. 712,733

3 Claims. (Cl. 153—32)

This invention relates generally to an apparatus for preparing wire type leads which extend generally axially from various types of electrical components. While this invention will be described in connection with the use thereof with electrical components, it is to be understood that the apparatus hereof may be used for preparing any type of elongated object, wire or rod, as may be desired.

In the use of devices such as electrical components in the form of resistors, capacitors, transistors and the like, having axially extending wire leads, it is often important that these leads be axially straight in order efficiently to permit such use. Such leads must also frequently be of predetermined lengths. The straight conditions of the leads and the precise combined length thereof greatly adds to the efficiency of use of the components in connection with their assembly in specific positions relative to an electronic unit such as, for example, a printed circuit sheet or between a pair of parallel circuit sheets in an electronic module commonly known as a cordwood type of assembly.

In the normal manufacturing, shipping, sorting and handling of electrical components, the leads thereof frequently become bent or otherwise disposed from an axial condition. While a component manufacturer may produce such components with substantially axially disposed leads, the normal process of handling such components produces these bent conditions and it is impractical to attempt to exercise the great care that would otherwise be necessary to maintain the original axial condition of the leads. Accordingly, it has become necessary to straighten the leads and such straightening may be accomplished in many ways. For example, many of the component leads are sufficiently flexible as to enable straightening by hand or with very simple tools. This hand method is often satisfactory for low production items; however, under mass production conditions, it is slow and inaccurate and therefore, from a practical standpoint, cannot be used. Various types of machines have also been proposed and utilized for this straightening purpose; however, most of these prior machines have been expensive, inefficient and often impractical.

As set forth hereinbefore, it is also desirable further to prepare the component leads by trimming such leads to a predetermined length, the manufacturer providing leads that are generally longer than normally required. It will be understood that this operation may also be carried out by hand and in many instances this is the case. However, when specific lead lengths are required, it is necessary that each lead be measured and then individually cut in order to complete the final preparation of the lead for use in the desired electrical assembly The hand method of trimming the leads is time consuming and impractical in high production situations. Additionally, it is important that a lead trimming operation be carried out immediately following a straightening operation in order that lead length may be determined along an axial position of the lead. In other words, the axial length of a bent lead will result in a longer lead following straightening of the bent lead. Accordingly, in the complete preparation of component leads, it is desirable that the leads be delivered directly from a straightening operation to the trimming operation and that there be no handling between these operations that may induce additional deformation of the leads.

It is, accordingly, one object of the present invention to provide an electrical component lead preparation apparatus having means for straightening such leads and trimming the leads to a predetermined length.

Another object of the invention is to provide an electrical component lead preparation apparatus having means for dispensing such components and for thereafter rolling the components between a pair of members to straighten the leads thereof.

A further object of the invention is to provide an electrical component lead preparation apparatus that is efficient in operation, reliable and effective in use, economical in manufacture and which may be used in mass production situations.

Still another object of the invention is to provide an electrical component lead preparation apparatus having means for disposing leads between a platen and a plate, rolling the leads therebetween to straighten such leads and further means for preventing scuffing contact between the plate and the platen.

A still further important object of the invention is to provide an electrical component lead preparation apparatus including relatively reciprocating members and a means for disposing an axial leaded component between such members.

Another object of the invention is to provide a combination electrical component lead straightening and trimming apparatus that is operatively cooperable, whereby to permit delivery of the components directly from a straightening operation to a trimming operation.

Other and further important objects of the invention will become apparent from the disclosures in the following detailed specification, appended claims and accompanying drawings, wherein:

Figures 1, 5:
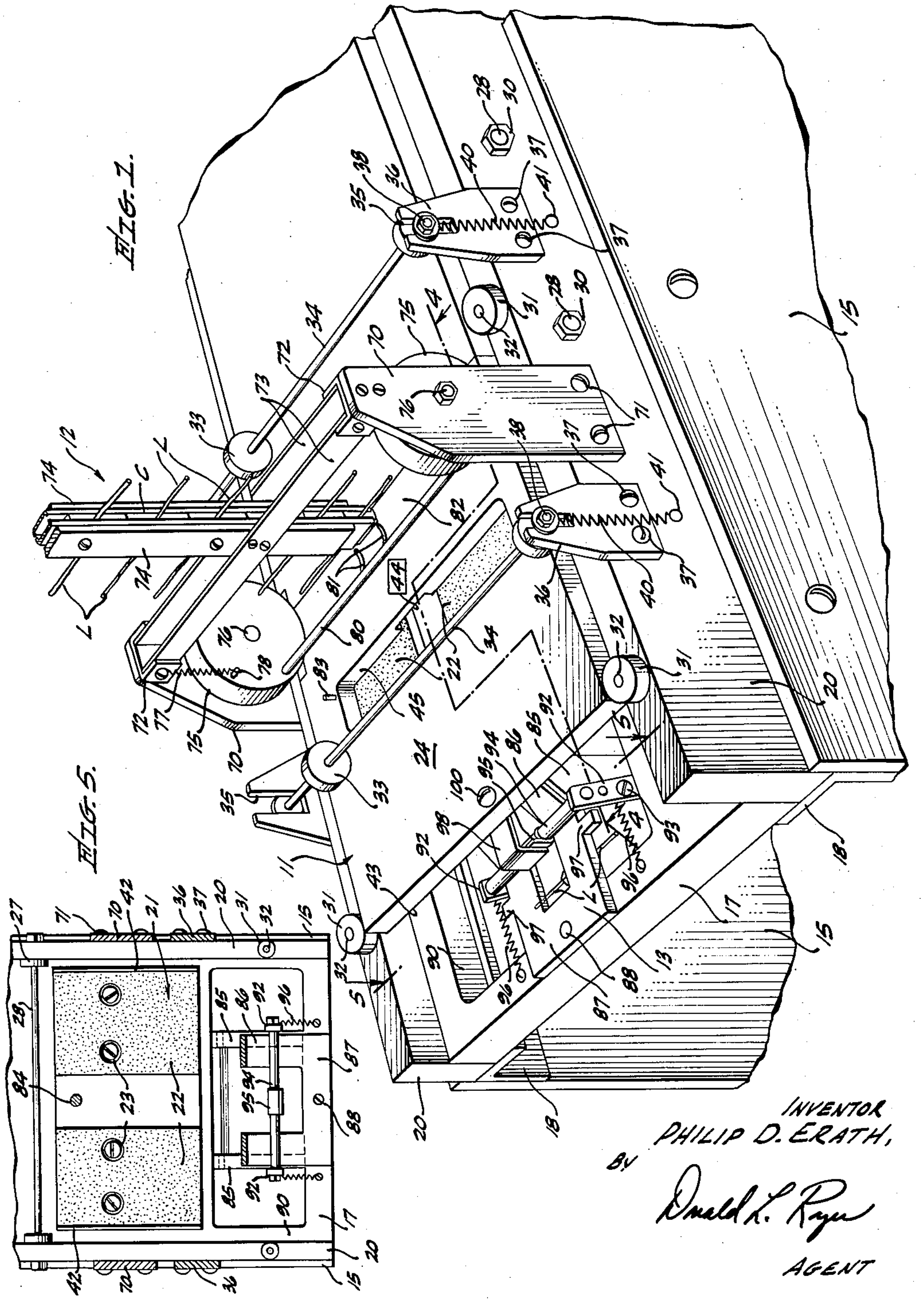
Figure 1 is a fragmentary perspective view of the component lead preparation apparatus of the present invention.
Figures 3, 4:
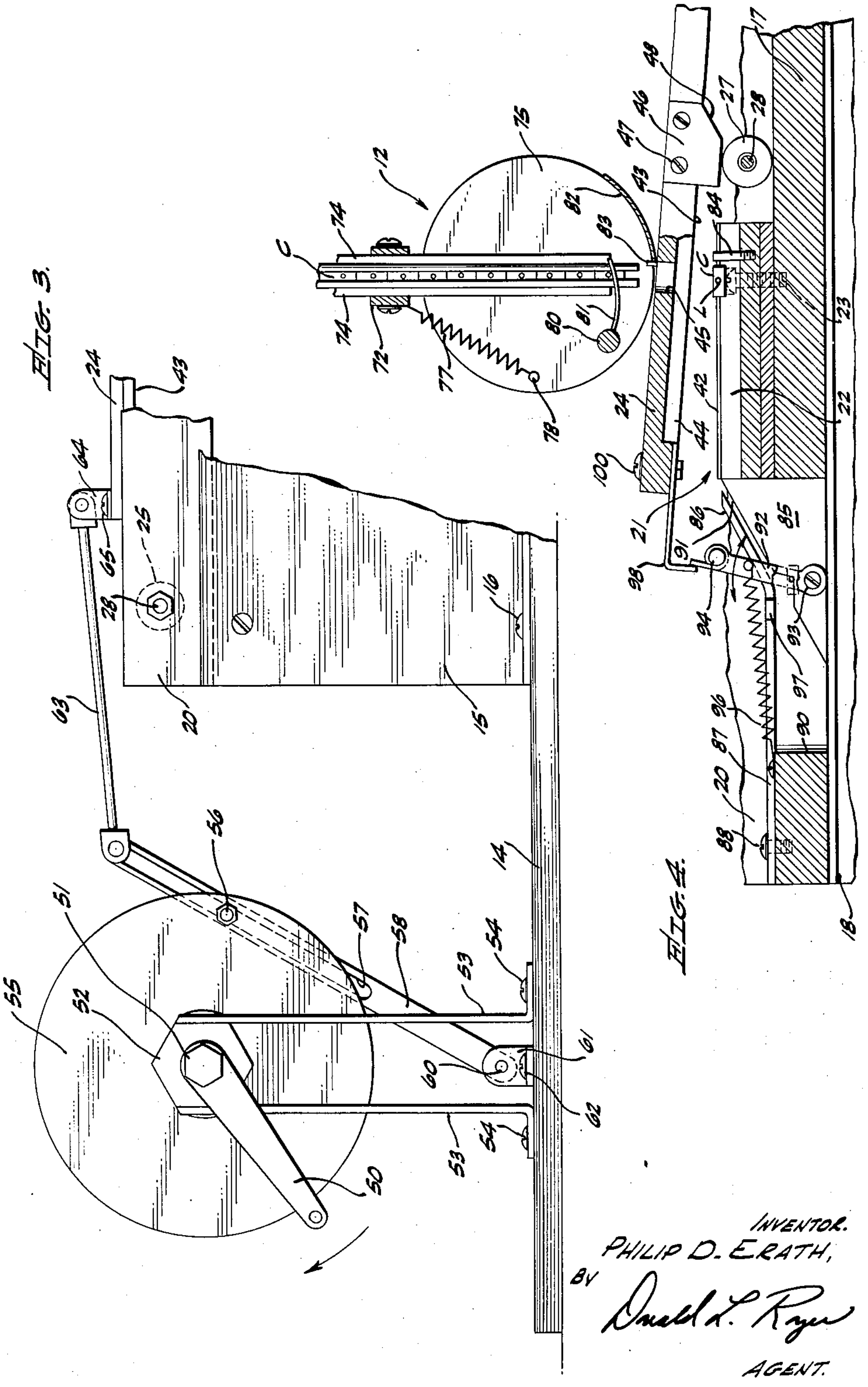
Fig. 3 is a fragmentary rear elevational view of a portion of the present apparatus showing components thereof in different positions.

Fig. 4 is an enlarged fragmentary sectional view showing the cooperative relationship between the dispensing apparatus, movable plate, platen and lead trimming apparatus, as taken substantially as indicated by line 4—4, Fig. 1; and Fig. 5 is a fragmentary top plan view, partially in section and partially broken away, to illustrate the platen and portions of the trimming mechanism, as taken substantially as indicated by line 5—5 of Fig. 1.

With reference to the drawings, the electrical component lead preparation apparatus of the present invention is shown as including, generally, a base structure 10, a lead straightening apparatus 11, a component dispensing apparatus 12 and a lead trimming apparatus 13. The base structure 10 includes a base plate member 14 having vertically extending, parallel side members 15 that are secured to the base member 14 as by screws 16. The side members 15 are adapted to support, adjacent upper edges thereof, a transversely disposed platen support member 17 that is connected to the side members 15 as by a pair of angle strips 18. Additionally, the strips 18 serve to support elongated side bars 20 that are disposed adjacent to and extend upwardly above the support member 17.

As shown in Figs 1, 4 and 5, the straightening apparatus 11 includes a divided platen 21 that is composed of a pair of integral platen members 22 in the form of sheets of material such as steel or the like that are secured to the platen support member 17 as by recess screws 23. The exposed surfaces of the platen members 22 are suitably roughened as by sandblasting, for a purpose to be hereinafter more fully described. A movable plate member 24 is poistioned with a lower surface thereof parallel to the platen 21. The plate member 24 is reciprocally disposed relative to the platen 21 and is supported on a plurality of rollers 25, 26 and 27 that are carried on shafts 28 that are in turn supported by the side bars 20, the shafts 28 being retained in position by means of nuts 30. The plate member 24 is guided laterally by means of rollers 31 that are journalled on pins 32 that are in turn connected to upper surfaces of the side bars 20. Additionally, the plate member 24 is normally urged downwardly toward the platen 21 by means of rollers 33 which engage an upper surface of the plate member and which are carried on shafts 34. The shafts 34 are disposed through vertically extending slots 35 in brackets 36 that are mounted on and extend upwardly from the side bars 20, the brackets 36 being secured in position by means of screws 37. Outer lateral ends of the shafts 34 are provided with enlargements in the form of a washer and nut combination 38 with the shafts 34 and rollers 33 being biased in a downward direction by means of tension springs 40 that are connected to ends of each of the shafts 34 and extend downwardly for connection to pins 41 that are disposed from the side bars 20. Thus, the plate 24 is urged toward the platen 21; however, the platen members 22 of the platen 21 are provided with integral raised edged strips 42 on which a lower surface 43 of the plate 24 is adapted to ride. Thus, the surface 43 is maintained in slight spaced relationship to the surfaces of the platen members 22.

As shown primarily in Fig. 4, the plate member 24 is provided with a longitudinal groove 44 in the surface 43 thereof, for a purpose to be hereinafter more fully described. The plate member 24 is also provided with a laterally disposed, generally rectangular opening 45 through which electrical components are passed by the dispensing apparatus 12, as will be hereinafter more fully described.

As shown further in Fig. 4, the plate member 24 is provided with a pair of downwardly extending cam members 46 that are disposed in notches in lateral sides of the plate member and secured therein by means of screws 47. The cam members 46 have inclined surfaces 48 that are adapted for engagement and cooperation with the rollers 27 whereby to raise the plate 24 away from the platen 21 upon each reciprocation of the plate 24.

Figure 2:
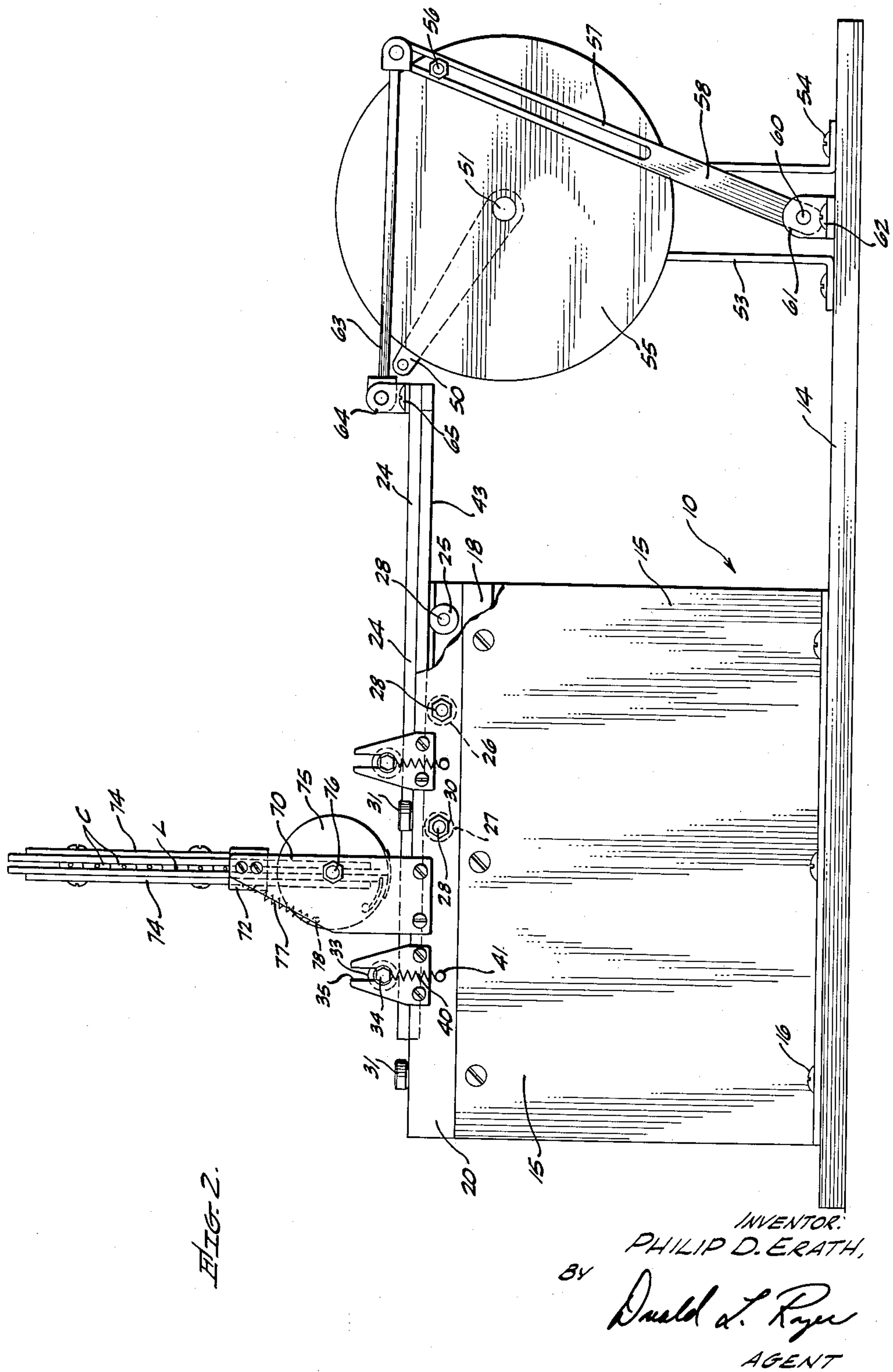
Fig. 2 is a front elevational view of the present electrical component lead preparation apparatus.

With reference primarily to Figs. 2 and 3, reciprocation of the plate 24 is shown as being accomplished by means of a driving mechanism including a crank handle 50 mounted on a shaft 51 that is in turn journalled in a bearing block 52. The bearing block 52 is supported on brackets 53 that are in turn secured to a base plate member 14 as by screws 54. The shaft 51 serves to support a wheel 55 that carries a pin 56 adajacent the periphery thereof. The pin 56 is slidably disposed in a slot 57 in an arm 58 that is pivoted as at 60 to a bracket 61 that is in turn connected to the base plate member 14 as by screws 62. An upper end of the arm 58 is pivotally connected to a link 63 that is in turn pivotally attached to a bracket 64 that is mounted on one end of the plate member 24 and secured thereto by means of screws 65. Upon rotation of the crank 50, the arm 58 and link 63 will be reciprocated, whereby also to reciprocate the plate member 24. While the reciprocation of the plate 24 is shown as being accomplished by the crank 50 and the associated mechanism, it is to be understood that this hand method of operation is by way of example only and that a motor type drive may be applied to the shaft 51 without departing from the spirit and scope of the present invention.

With reference to Figs. 1, 2 and 4, the electrical component dispensing apparatus 12, utilized with the present lead preparation apparatus, includes a pair of vertically extending support plates 70 that are secured to and extend above the upper surface of the side bars 20 as by screws 71. Upper ends of the support plates 70 are adapted to carry U-shaped brackets 72 which in turn support tie bars 73 which extend laterally between the brackets 72. The tie bars 73 support vertically disposed and spaced, channeled chute members 74 between which axially leaded components C are disposed. The components C are retained between the chute members 74, with leads L thereof extending laterally from between the chute members, and are individually dispensed therefrom and through the opening 45 of the plate 24 and onto the platen 21. This individual dispensing is accomplished by means of a mechanism including a pair of wheels 75 that are mounted on stub shafts 76 that are in turn carried by the support plates 70. The wheels 75 are normally biased for rotation in a clockwise direction, as seen in Figs. 1 and 4, by means of a tension spring 77 that is disposed between a pin 78 and one of the brackets 72, with the wheels 75 being normally disposed in a pivotal position at a lower limit of tensile force of the spring 77. A rod 80 is disposed between the wheels 75, this rod carrying a pair of curved fingers 81 in a central area thereof and in spaced relationship for disposition each on a lateral side of and adjacent to the chute members 74. The wheels 75 also carry a laterally disposed curved tray member 82 attached to an outer perphery of the wheels and having one circumferential edge overlying a radial position of free ends of the fingers 81.

Upon each reciprocal movement of the plate 24, a pin 83, extending upwardly from an upper surface of the plate 24, is adapted to engage an edge of the tray member 82, whereby to rotate the wheels 75 in a counter-clockwise direction and against the force of the tension spring 77. Upon such rotation of the wheels 75, the fingers 81 will be disposed on opposite sides of the chute member 74, whereby to retain a penultimate component C within the chute by engagement with the leads L thereof, and permit a last component C to be dropped from the tray 82 through the opening 45 and onto the platen 21. As the pin 83 is moved away from the edge of the tray 82, the fingers 81 are moved out of engagement with the previously penultimate component C and this component is permitted to drop upon the tray 82 for delivery therefrom through the opening 45 upon the next reciprocal movement of the plate 24.

A component C′ is shown in Fig. 4 as resting upon the platen 21, with the body of the component being disposed between the platen members 22 and the leads thereof resting upon the roughened surfaces of these platen members 22. It is to be noted that as the plate member 24 is reciprocated to a position to receive a component through the opening 45, and from the tray 82, this plate member 24 has been raised out of contact with the edges 42 of the platen 21 by engagement of the cam members 46 with the rollers 47. The plate member 24 is shown in Fig. 4 in a position assumed at a rightward end of travel, as viewed in Fig. 4, with continued movement of the plate member 24 being in a leftward direction, whereby to reposition the plate 24 in contact with the leads L of the component C′ resting upon the platen 21, whereby to roll the leads along the roughened surfaces of the platen members 22, thus to straighten these leads. Accordingly, the components C′ will move in a leftward direction, as viewed in Fig. 4, along the platen 21 during the rolling and straightening action thererof. The slot 44 in the lower surface 43 in the plate member 24 serves to provide a relief space for the component body, with the surface 43 of the plate member 24 resting upon the leads L of the component C′. The height of the edges 42 of the platen members 22 is less than the diameter of the leads L. Any tendency of the component C′ to move in a rightward direction, as viewed in Fig. 4, is stopped by means of a pin 84 that is carried by the platen 21 and extends upwardly therefrom intermediate the platen members 22.

It is to be noted that the tension springs 40 connected to the shafts 34 and rollers 33 serve to bias the plate member 24 into contact with the leads L. It is also to be noted that the roughened surfaces of the platen members 22 serve to prevent any skidding or sliding of the leads L and insure a rolling action thereof, thus to staighten the leads.

Upon continued leftward movement of the plate 24, as viewed in Fig. 4, the straightening component C′ will be moved from the leftward end of the platen 21 and onto upper edges of a pair of laterally spaced inclined members 85. The leads of the component C′ are retained in contact with the inclined members 85 by means of guide fingers 86 that are disposed from a guide member 87 that is in turn mounted on the platen support member 17 and secured thereto by means of a screw 88. The platen support member 17 is provided with a generally rectangular opening 90 in which lower portions of the inclined members 85 are disposed.

The inclined members 85, together with the fingers 86, form a portion of the lead trimming apparatus 13, this apparatus further including notches 91 in the upper edges of the inclined members 85 and into which the leads of the component C′ are adapted to traverse. As shown in Figs. 1, 4 and 5, a pair of cutoff arms 92 are pivotally secured to the inclined members 85 as at 93. The cutoff arms 92 are interconnected at upper ends thereof by means of a rod 94, the center portion of which supports a tab 95. The arms 92 are also biased in a leftward direction, as viewed in Fig. 4, by means of a pair of tension springs 96 that are disposed between the arms 92 and the platen support member 17. Leftward movement of the arms 92 is limited by means of tabs 97 that extend outwardly from the fingers 86.

As shown in Figs. 1 and 4, the plate member 24 has an angularly disposed trigger member 98 that is secured to one end of the plate member 24 as by a screw 100. As the plate member 24 approaches its rightward limit of travel, the leads L of the component positioned in the notches 91 will be severed between the sides of the notches 91 and the cutter arms 92 by movement of the cutter arms 92 by engagement of the trigger member 98 with the tab 95 carried by the rod 94. The lateral spacing of the inclined members 85 is of a predetermined value, thus to trim the component leads to a predetermined length, the component with trimmed leads thereafter continuing along upper edges of the inclined members 85 and therefrom through the opening 90 and into a suitable container (not shown) that may be provided for receiving the finally prepared components and leads thereof.

It is to be noted that there is a direct transfer of the components with straightened leads from the straightening operation to the trimming operation, and that there is no handling therebetween or means by which the component leads may again be bent prior to the trimming operation, thus providing a complete preparation of the component leads. Following the trimming operation, the plate member 24 is again in position to receive the next component to repeat the cycle.

Having thus described the invention and the present embodiment thereof, it is desired to emphasize the fact that many modifications may be resorted to in a manner limited only by a just interpretation of the following claims.

I claim:

1. An electrical component lead preparation apparatus comprising: a base structure; an elongated platen carried by said base structure; an elongated plate carried by said base structure, said plate having a longitudinal component receiving groove facing said platen and positioned for reciprocal movement over and closely adjacent a face of and relative to said platen; means for reciprocating said plate; a laterally extending opening in said plate, said opening overlying one end of said platen when said plate is located at one reciprocal end position thereof; a component dispensing apparatus for delivering components through said opening and onto said platen in response to reciprocation of said plate; means for biasing said plate toward said platen; and means for moving said plate against said biasing means and away from said platen upon delivery of a component to said platen; means for thereafter repositioning said plate closely adjacent said platen upon said reciprocation thereof, whereby said leads of said component are rolled between said platen and said plate thereby to straighten said leads, one of said components being delivered from said platen upon each reciprocal movement of said plate.

2. An electrical component lead preparation apparatus comprising, in combination: a base structure; an elongated horizontally disposed platen carried by said base structure, said platen having a roughened surface; an elongated plate carried by rollers supported by said base structure, said plate having a longitudinal component receiving groove facing said platen and being positioned for reciprocal movement over and closely adjacent said surface of and relative to said platen; means for reciprocating said plate; a laterally extending opening in said plate, said opening overlying one end of said platen when said plate is located at one reciprocal end position thereof; a component dispensing apparatus for individually delivering components through said opening and onto said surface of said platen; trigger means carried by said plate and engageable with said dispensing apparatus for triggering said apparatus to effect delivery of said components in response to reciprocation of said plate; spring loaded roller means carried by said base structure and engageable with said plate for biasing said plate toward said platen; and means for moving said plate against said spring loaded roller means and away from said platen upon delivery of a component to said platen; means for thereafter repositioning said plate closely adjacent said platen upon said reciprocation thereof, whereby said leads of said component are rolled between said platen and said plate thereby to straighten said leads, one of said components being delivered from said platen upon each reciprocal movement of said plate.

3. An electrical component lead preparation apparatus comprising, in combination: a base structure; an elongated horizontally disposed longitudinally divided platen carried by said base structure, said platen having a roughened surface; an elongated plate carried by rollers supported by said base structure, said plate being positioned for reciprocal movement over and closely adjacent said surface of and relative to said surface of said platen; means for reciprocating said plate; a laterally extending opening in said plate, said opening overlying one end of said platen when said plate is located at one reciprocal end position thereof; a longitudinal groove in said plate overlying a central longitudinal area of said divided platen; a component dispensing apparatus for individually delivering components through said opening and onto said surface of said platen; trigger means carried by said plate and engageable with said dispensing apparatus for triggering said apparatus to effect individual delivery of said components in response to reciprocation of said plate; spring loaded roller means carried by said base structure and engageable with said plate for biasing said plate toward said surface of said platen; means for moving said plate against said spring loaded roller means and away from said platen surface upon delivery of a component to said platen; means for thereafter repositioning said plate closely adjacent said platen upon said reciprocation thereof, whereby said leads of said component are rolled between said platen surface and said plate thereby to straighten said leads, one of said components being delivered from said platen upon each reciprocal movement of said plate; and means for preventing contact between said platen and said plate in the absence of component leads therebetween.

References Cited in the file of this patent

UNITED STATES PATENTS

| | | |
|---|---|---|
| 60,260 | Safely | Dec. 4, 1866 |
| 503,393 | Vollmer | Aug. 15, 1893 |
| 2,713,362 | Stahl | July 19, 1955 |

FOREIGN PATENTS

| | | |
|---|---|---|
| 1,062 | Great Britain | Mar. 18, 1879 |